United States Patent [19]

Wörner

[11] Patent Number: 4,929,281
[45] Date of Patent: May 29, 1990

[54] METHOD FOR PRODUCING THIN-FILM SOLAR CELLS IN A SERIES-CONNECTED ARRAY

[75] Inventor: Jörg Wörner, Grosskrotzenburg, Fed. Rep. of Germany

[73] Assignee: NUKEM GmbH, Hanau, Fed. Rep. of Germany

[21] Appl. No.: 176,268

[22] Filed: Mar. 31, 1988

[30] Foreign Application Priority Data

Apr. 14, 1987 [DE] Fed. Rep. of Germany ....... 3712589

[51] Int. Cl.$^5$ .............................................. H01L 35/34
[52] U.S. Cl. ..................................... 136/201; 136/206
[58] Field of Search ............................... 136/201, 206

[56] References Cited

U.S. PATENT DOCUMENTS

| 3,617,376 | 11/1971 | Miller | 117/221 |
|---|---|---|---|
| 3,956,017 | 5/1976 | Shigemasa | 136/89 |
| 4,178,524 | 12/1979 | Ritter | 310/304 |
| 4,525,223 | 6/1985 | Tsuya et al. | 437/81 X |
| 4,710,588 | 12/1987 | Ellion | 136/206 |

FOREIGN PATENT DOCUMENTS 2839038 3/1979 Fed. Rep. of Germany .

Primary Examiner—Peter A. Nelson
Attorney, Agent, or Firm—Beveridge, DeGrandi & Weilacher

[57] ABSTRACT

Disclosed is a method for producing an array of thin-film solar cells so that the individual solar cells are electrically connected in series. Individual solar cells are manufactured by depositing and structuring the layers required by each solar cell on a large-area substrate. According to the invention, a first electrode layer is structured before subsequent layers, including a semiconductive material layer and a second electrode layer, are deposited. Preferably, the structures of the subsequently deposited layers are determined by simultaneously applying material in paste form to the first electrode layer.

24 Claims, 2 Drawing Sheets

METHOD FOR PRODUCING THIN-FILM SOLAR CELLS IN A SERIES-CONNECTED ARRAY

BACKGROUND OF THE INVENTION

A method is disclosed for producing a plurality of thin-film solar cells connected in series, arranged on a common substrate and made up by depositing in sequence one upon the other, a first electrode layer, at least one layer consisting of semiconductive material and a second electrode layer, said layers being of large area and specially structured to form the series connection.

In order to be able to satisfy the application-related demands for voltage ranges from 12 to 15 volts, it is necessary to connect solar cells in series. Compared with the connection of discrete crystalline silicon wafers, thin-film solar cells offer a significant advantage, namely, the possibility of production by depositing large-area films onto substrates by spraying, evaporation deposition and plasma discharge processes, said films then being divided into individual solar cell areas and electrically connected.

The DE-OS 28, 39, 038 represents an example thereof. This paper relates to methods of the type mentioned in the opening paragraph, in which an area of the substrate is initially completely coated with a film of transparent, electrically conductive material on top of which is added a second film of at least one semiconductive material, whereafter sections of said films are selectively removed to form on the substrate a plurality of regularly spaced photovoltaic cells. Subsequently applied is a large area covering film to serve as a second electrode layer. To permit the necessary series connection, this covering layer is interrupted in the direct neighborhood of those strips at which material has been selectively removed from the first electrode layer and from the semiconductor layers above it.

Known methods of achieving separation between individual areas referred to as "structuring" the layers—include, for example, material removal processes of a thermal, mechanical or chemical nature, or those employing structuring bar or lift-off technology. However, such removal methods have considerable disadvantages. For instance, the formation of condensate on a cool point on the substrate when removing material by thermal means; scattered flaked-off material and fissures in the remaining layer in the case of mechanical removal; or under-cutting due to inhomogeneous chemical attack by the etching agent and failure to totally remove all residues of said agent when removing material by chemical means. If the drying conditions for the lift-off material lie in a critical temperature range for the semiconductor, incomplete removal of the lift-off material can result (e.g., metal oxides or organic material such as caoutchouc).

The disadvantages of the previously mentioned removal processes are particularly serious when material particles measuring several $\mu m$ to almost 20 to 30 $\mu m$ (e.g., of the conductive transparent first layer) remain in areas (possibly due to condensed material and thus formation of chemical compounds) in which the semiconductor layer(s) are to be subsequently applied. In the case of an amorphous Si solar cell, for example, said layer(s) is/are not even 1 $\mu m$ thick. Typical thicknesses of the a-Si semiconductor layer are in the order of 500 to 700 nm, so that the presence of such particles can cause short circuits between the first and second electrode layers.

A special disadvantage of the DE-OS 28 39 038 method (in which, as mentioned, the first electrode layer plus the semiconductive material deposited on it are structured together) can also be seen from the fact that, in the case of a chemical removal process, for instance, reactions occur (primarily of an oxidative nature—air, acids) which lead to undefined layer compositions (stoichiometric modification, $SiO_2$ formation), and consequently degrade the quality of the semiconductor layer. In a-Si solar cells alkaline solutions (NaOH, KOH) are also used to remote areas of material, by which the quality reduction suffered by the a-Si material through alkaline ions is familiar. As already mentioned, mechanical processes for removing the uppermost semiconductor layer material from the electrode layer below it frequently cause mechanical damage to the latter, so that the contact to be finally made between the first and second electrode layers can prove to be inadequate. Thermal removal, e.g., by laser light, also leads to analogous modifications in the upper surface of the first electrode layer.

SUMMARY OF THE INVENTION:

The aim of the present invention is to create a method of the wherein structuring necessary to connect the thin-film solar cells arranged on a common substrate can be essentially achieved without damaging the individual layers, and without necessitating the auxiliary layers characteristic of the current state of the art. The intention is also to design the connecting areas between the individual electrode layers to be as narrow as possible, so as to allow optimum utilization of the photoactive material.

The task is essentially solved by structuring the first electrode layer prior to depositing the other layers. This method allows structuring to take place immediately after depositing the first electrode layer, but also beforehand. The latter option means that the structure is first defined on the glass substrate, e.g., by depositing removable material, to which the electrode layer is then applied, and subsequently removing or treating the material in such a way that electrically isolated areas, preferably in strip-form, are formed in the electrode layer. The term 'deposition' is not intended in this case to mean only, for example, the deposition or precipitation of material, but if necessary also post-treatment, conditioning or optimization, e.g., of the sheet resistance or transparency. Of course, deposition can also be taken to simply mean the arrangement of the layer on the substrate.

A particularly suitable material is $TiO_2$ when the electrode layer consists of ITO. Moreover, when structuring is complete, the ITO layer material can be optimized in order to eliminate unwanted resistance changes which may have occurred.

It is preferable to deposit paste-form material in lines, which are deposited to run parallel to the desired structure of the electrode layer. Such materials facilitate the structuring of the subsequent layers, and are also used as guide lines for the structuring of the electrode layer, e.g., by a laser following said lines.

In consequence of this, one abandons the state-of-the-art solution of not structuring before at least the semiconductor layers have been deposited on the first electrode layer. On the contrary, according to this invention, essential structuring of the first electrode layer for series connecting the individual thin-film solar cells is done before depositing further layers. Thus the first electrode layer can be structured using means which would otherwise have undesirable effects on the layers above, especially on the semiconductor layer(s).

For preference, the structuring of the first electrode layer is done by converting areas of the electrode material into a material of high resistivity. This can be achieved, e.g., by spark discharge erosion with wherein the first electrode layer in the region of a narrow spark discharge (e,g., achievable with a metal scalpel) melts, and is deliberately rapidly re-cooled so that the melted material condenses again in the immediate vicinity. In this case there is no removal of material as such, but solely conversion of the material from an electrically conductive state into a material of high resistivity. The cooling action can be achieved by a water-alcohol mixture, for example.

A proposed refinement of the invention comprises depositing an electrically conductive material is deposited on the first electrode layer preferentially at the same time that said layer is structured; said electrically conductive material to be covered by the further layers, whereafter an electrically conductive link is established from the second electrode layer to said electrically conductive material to facilitate connection. The electrically conductive material should preferentially be a paste, e.g., Ag paste, arranged in narrow strips immediately adjacent to the narrow areas of the first electrode layer, which are converted into material of high resistivity, e.g., through the previously mentioned steps of converting the material.

According to another form of the invention, another material is applied parallelly to the electrically conductive material and preferentially at the same time; said material determining the structuring of the layer of semiconductor material(s) and the second electrode layer. Such material can also be in paste form. Hereby and according to the material used, it will be possible to use heat treatment, or e.g., ultrasonic means, to fracture the material in such a controlled manner that the superimposed areas of the semiconductor layer and the second electrode layer are removed with it. In doing so it is not necessary for the so-called lift-off bars, or structuring bars or strips themselves to be completely removed, since they are of high resistivity.

In so far as, and as proposed by this invention, structuring of the first electrode layer (e.g., by erosion with a spark) is carried out concurrently with the deposition of the previously mentioned materials, one speaks of a so-called simultaneous structuring process, which is immediately followed by deposition of the semiconductor layer(s) and the second electrode layer. This simultaneous structuring is advantageously carried out with a single tool embodying a device for spark erosion and two further devices directly adjacent (or even overlapping), these latter devices depositing a pair of parallel narrow lines of paste; said lines being applied parallelly to the structuring of the first electrode layer. Although this simultaneous structuring process is regarded as preferable, the individual structuring processes can, of course, also be carried out separately using other methods e.g., with lasers (melting the material) or silk screen printing (depositing pastes in narrow strips).

In general, the task of the materials deposited on the electrode layer can be described as dictating the structure of the layers to be subsequently applied.

Further details of the invention can be seen from the claims, and from the features to be found therein individually and/or in combination.

BRIEF DESCRIPTION OF THE DRAWINGS

The invention is described below in more detail on the basis of the preferred design examples in the drawings, from which further details, advantages and features can be seen.

In the drawings.

Figures 1, 2:
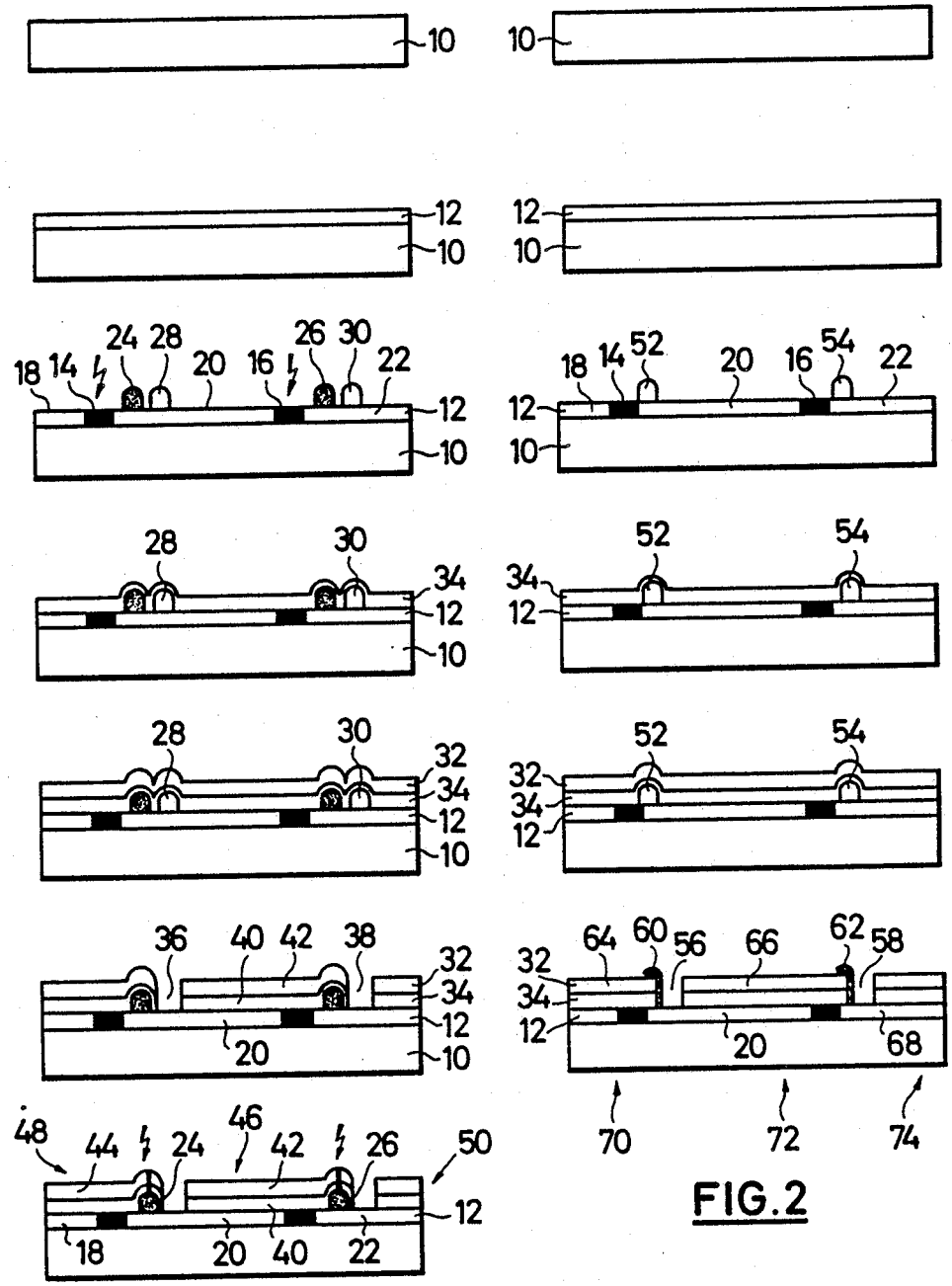
FIG. 1 is a schematic drawing of the sequence of steps for producing an array of thin-film solar cells connected in series in accordance with a first embodiment of the present invention.
FIG. 2 is a schematic drawing, similar to FIG. 1, which shows a sequence according to a second embodiment of the invention.

DETAILED DESCRIPTION OF THE PREFERRED EMBODIMENTS:

FIG. 1 is intended to illustrate in principle the sequence of steps for producing a plurality of thin-film solar cells which are series connected. Applied on a large-area scale to a substrate (10) is a first electrode layer (12), preferably comprising a transparent conductive oxide (TCO) such as ITO, stannic oxide or indium oxide. After having deposited the first electrode layer (12), bar-like areas (14) and (16) are formed in the electrode layer (12) to effect an insulating barrier between the interposing areas (18), (20) and (22). Said bars are spaced according to the desired structure, and run mutually parallel from one side of the substrate (10) to the other, that is to say, they are viewed in cross-section in the drawing. The bars (14) and (16) in the design example are formed by spark discharge erosion whereby no material is removed but instead the conductive material is converted into a high-resistivity state by heating and then cooling or quenching. Naturally, it is also possible to remove the electrode layer material (12) in the space occupied by the bars (14) and (16). Preferably simultaneously with the formation of the insulating areas (14) and (16) linear strips of paste (24), (26) and (28), (30) are deposited in parallel, said strips having various tasks to perform. Hereby the strips of paste (24), (26) and (28), (30) are each arranged on one side—on the left in the design example—of areas (18), (20) and (22) of the electrode layer (12) adjacent to the therein contained barriers (14) and (16).

The connecting strips or bars (24) and (26), also known as stitch bars, have the task in a completed thin-film solar cell array of establishing the electrically conductive connection between the first electrode layer (12) and a second electrode layer (32) in such a manner that the individual thin-film solar cells are connected in series. In contrast, the structuring strips or bars (28) and (30), also known as lift-off bars, are intended to structure the subsequently to be deposited semiconductor layer (34) and the second electrode layer (32). The widths of strips (24), (26), (28) and (30) are each 50–200 $\mu$m with a preferred height of 5–10 $\mu$m and possibly 20 $\mu$m.

Especially mentioned as a material for the connection or stitch strips or bars (24) and (26) is a bakable silver paste with a solid material content of 80–85 % by weight and a baking temperature of 400°–460° C. The advantage of this material is that the substrate (10) is not distorted and the electrode layer (12) is hardly subject to thermal stressing, in so far as it consists of TCO, especially ITO.

Especially mentioned as a material for the structuring or lift-off bars (28) and (30) is a paste such as $TiO_2$ with a solid content of 20% by weight, also with TCO used as the electrode layer material.

After the first electrode layer (12) has been structured and the bars (24), (26), (28) and (30), preferably of paste materials, have been applied in lines, the semiconductor layer (34) is deposited over the full area. In actual fact, the semiconductor layer (34) is thereby multi-layered so that light falling on it generates charge carriers, which are conducted to the electrodes. The semiconductor layer (34) and the second electrode layer (32) are, as mentioned, deposited over the complete area of the first electrode layer (12), thus also covering the materials (24), (26), (28) and 30). In this way, assuming suitable materials, the lift-off bars (28) and (30) can be removed by the effects of, say, ultrasonic oscillation carrying with them the superimposed areas of the semiconductor layer (34) and the second electrode layer (32). Formed in consequence are free spaces (36) and (38), which separate the semiconductor layer (34) and the second electrode layer (32) into discrete areas so forming the individual thin-layer solar cells. Consequently, in the drawing, section (20) of the first electrode layer together with section (40) of the semiconductor layer (34) and section (42) of the second electrode layer form one individual thin-film solar cell. In order to provide a path for the charge carriers and to connect the individual neighboring thin-film solar cells in series, the final step in the method involves establishing contact between the areas (18), (20) and (22) of first electrode layer (12) and the appropriately corresponding areas (42) and (44) of the second electrode layer. This contact can preferably also be established by spark erosion linking the stitch-bars (24) and (26) to the areas (42) and (44). This brings center solar cell (46), made up of the layers (20), (40) and (42), into series connection with the neighboring solar cells (48) and (50) respectively.

Naturally, the make-up of any solar cell can be modified so that the semiconductor layer (34) is multi-layered or, for example, so as to sandwich between the second electrode layer (32) and the underlying semiconductor layer (34) a further intermediate layer (not illustrated) such as an $SnO_x$ film, the task of said film being to reflect infra-red radiation thereby preventing the thin-film solar cell array from heating up.

FIG. 2 illustrates a method for producing a thin-film solar cell array, wherein the same designatory numbers apply to the same elements.

The structuring of the first electrode layer (12) prior to deposition of other layers, i.e., the semiconductor layer (34) and the second electrode layer (32), takes place as in the process illustrated in FIG. 1. Hereby the barriers (14) and (16), which separate areas (18), (20) and (22), can also be formed by material state conversion or else by mechanical removal. Thereafter in the immediate neighborhood of barriers (14) and (16) lift-off bars (52) and (54) are applied to the areas (20) and (22), which then correspond to the lift-off bars (28) and (30) shown in FIG. 1. Subsequently deposited over a large area, in accordance with the description of FIG. 1., are the semiconductor layer (34) and the second electrode layer (32) with an intermediate layer previously positioned, if and when required. This having been done, the lift-off bars (52) and (54) are removed to achieve structuring of the semiconductor layer (34) and the second electrode layer (32). Strips of conductive paste (60) and (62) formed, for example, by using the screen printing method can then be introduced into the open spaces (56) and (58). Said paste establishes the link between area (64) of the second electrode layer (32) and area (20) of the first electrode layer (12), and between area (66) and area (68) respectively to connect the partially illustrated individual thin-film solar cells (70), (72) and (74) in electrical series.

Figure 3:
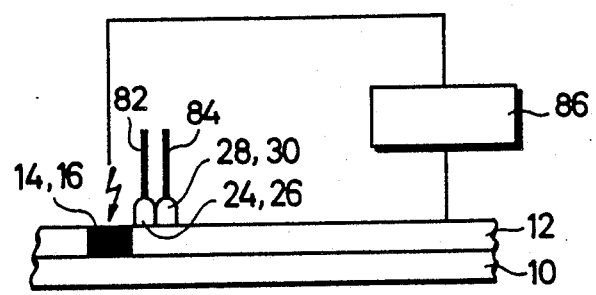
FIG. 3 is a diagram showing production of structure.
Figure 4:
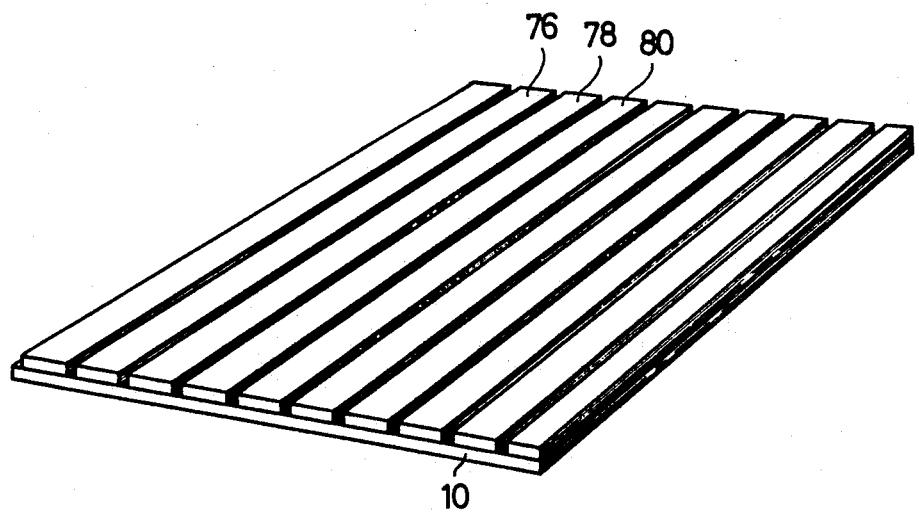
FIG. 4 is a perspective view of a thin-film solar cell array according to the invention.

FIG. 4 is a purely schematic and perspective drawing of a thin-layer solar cell array. It is intended to illustrate a plurality of parallel disposed thin-film solar cells arranged on a substrate (10) by the method previously described, some of said solar cells being annotated with reference numbers (76), (78) and (80) as examples. These physically parallel thin-layer solar cells (76), (78) and (80) are electrically connected in series to enable the array to deliver the required voltage. In order to produce the individual solar cells (76), (78) and (80) it is preferable to employ a tool as illustrated in purely schematic form in FIG. 3.

It can be seen that the first electrode layer (12) arranged on the substrate (10) is preferable structured from TCO using the spark erosion method, so as to create the strip-shaped areas (14) and (16) respectively. At the same time the tool has nozzles (82) and (84) through which the strips of paste (24), (26) and (28), (30) respectively, are continuously extruded in parallel next to areas (14) and (16) on the surface of the electrode layer (12). The materials used for said strips (24), (26) are, as previously mentioned, preferably bakable silver pastes, whereas strips (28) and (30) are preferably formed from $TiO_2$.

The actual spark erosion action is depicted by a flash symbol above areas (14), (16). Discharge is through a scalpel-shaped electrode. To ensure that spark discharge occurs, a current generator (86) must be provided, one pole of which is connected with the surface of the electrode layer (12) and the other pole with the scalpel-shaped electrode (not illustrated).

The tool, which can be seen from FIG. 3, can be modified as a multi-purpose device. That is to say, to produce the thin-film solar cell array as per FIG. 4, several scalpel electrodes and nozzles (82) and (84) can be adjacently arranged to simultaneously provide the structure of several thin-film solar cells arranged parallel to one another.

I claim:

1. A method for producing thin-film solar cells connected in series, said method comprising the steps of:
   depositing a first electrode layer on a substrate having a large area,
   structuring said first electrode layer,
   after said structuring of said first electrode layer, depositing at least one layer of semiconductive material over said first electrode layer,
   depositing a second electrode layer over said at least one layer of semiconductive material, and
   structuring said at least one layer of semiconductive material and said second electrode layer for producing said thin-film solar cells and connecting said solar cells in a side-by-side arrangement in series.

2. A method for producing thin-film solar cells connected in series, said method comprising the steps of:

depositing a first electrode layer on a substrate having a large area, simultaneously structuring said first electrode layer and depositing strips of a further structuring material on said first electrode layer in parallel with its structure, after said structuring of said first electrode layer and said depositing of said strips, depositing at least one layer of semiconductive material over said first electrode layer, depositing a second electrode layer over said at least one layer of semiconductive material, and structuring said at least one layer of semiconductive material and said second electrode layer for producing said thin-film solar cells in a side-by-side arrangement and connecting said solar cells in series, whereby said strips are covered by said at least one layer of semiconductive material and said second electrode layer, whereafter the strips of further structuring material are removed together with portions of the semiconductive material and second electrode layers, and whereafter for side-by-side electrical connection of said thin-film solar cells, a link is provided through said at least one layer of semiconductive material and said second electrode layer to establish an electrical connection between said second electrode layer and said first electrode layer.

3. A method according to claim 1, wherein for said step of structuring of said first electrode material, a material which determines the structure of said first electrode layer is deposited on the substrate prior to depositing said first electrode material, and after said first electrode material is deposited, said material is removed whereby said electrode layer is structured.

4. Method according to claim 3, wherein said material is in paste for and comprises an organic solvent and said first electrode layer comprises a transparent conductive oxide including Indium Tin oxide and whereby prior to depositing said at least one layer of semiconductive material and said second electrode layer, said paste-form material is cured and at least any organic solvent is removed.

5. Method according to claim 1, wherein simultaneously with said structuring of said first electrode layer, electrically conductive material is deposited on said first electrode layer and parallel to its structure, and after depositing of said at least one layer of semiconductive material and said second electrode layer, solar cells arranged side by side are connected in series via said conductive material.

6. Method according to claim 1, further comprising the step of depositing further material onto said first electrode layer for structuring said at least one layer of semiconductive material and said second electrode layer.

7. Method according to claim 6, wherein said further material consists of $TIO_2$ pastes deposited in strip-form on said first electrode layer.

8. Method according to claim 5, wherein a material for structuring said at least one semiconductive layer and said second electrode layer is deposited parallel to said electrically conductive material.

9. Method according to claim 6, wherein simultaneously with said structuring of said first electrode layer, said material is deposited on said first electrode layer for structuring said at least one semiconductive layer and said second electrode layer.

10. Method according to claim 1, wherein the structuring of said first electrode layer is achieved by locally confined conversion into a material having high resistivity.

11. Method according to claim 1, wherein the structuring of said first electrode layer is achieved by spark erosion.

12. Method according to claim 10, wherein the structuring of said first electrode layer is achieved by spark erosion.

13. Method according to claim 5, wherein the electrically conductive material consists of a paste.

14. Method according to claim 6, wherein said material for structuring said at least one layer of semiconductive material and said second electrode layer has high resistivity, said material being caused to oscillate by ultra-sonic means so as to destroy the above-lying areas of said semiconductive layer and said second electrode layer.

15. Method according to claim 5, wherein contact between said electrically conductive material and said second electrode layer is established by erosive spark discharging.

16. Method according to claim 8, wherein said electrically conductive material and said material for structuring said semiconductive layer and said second electrode layer are arranged in strip form parallel to the structuring feature providing for the electrical isolation of said first electrode layer.

17. Method according to claim 8, wherein said electrically conductive material and said material for structuring said at least one semiconductive material layer and said second electrode layer are deposited next to each other on said first electrode layer.

18. Method according to claim 10, wherein said first electrode layer consists of transparent conductive material, and is structure by melting parallel-running, strip-shaped areas and immediately thereafter cooling said layer.

19. Method according to claim 1, wherein said steps of structuring of said first electrode layer and depositing said structuring material for said layers to be subsequently deposited are carried out simultaneously by means of one tool.

20. A method according to claim 13, wherein said paste is a bakable silver paste which is baked at a temperature of 400°-460° C.

21. A method according to claim 17, wherein said electrically conductive material and said material for structuring are deposited at the same time.

22. Method according to claim 2, wherein strips of electrically conductive material are deposited in parallel to said strips of said further structuring material and a portion of said link is provided by said strips of electrically conductive material.

23. Method according to claim 4, wherein said paste-form material consists of $TiO_2$.

24. A method according to claim 8, wherein said material which structures said semiconductive and said second electrode layers is deposited simultaneously with said electrically conductive material.

* * * * *